(12) United States Patent
Asada et al.

(10) Patent No.: US 6,235,997 B1
(45) Date of Patent: *May 22, 2001

(54) LSI PACKAGE WITH EQUAL LENGTH TRANSMISSION LINES

(75) Inventors: Kenji Asada; Yoshihiko Ikemoto; Toshio Hamano, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,560

(22) Filed: Jun. 17, 1998

(30) Foreign Application Priority Data

Aug. 25, 1997 (JP) .................................................. 9-228548

(51) Int. Cl.[7] ................................ H05K 1/16; H01R 9/09
(52) U.S. Cl. .......................... 174/260; 174/261; 361/777; 257/700; 257/691; 257/664
(58) Field of Search ................................... 361/764, 777, 361/778, 779; 174/260, 261; 257/664, 700, 698, 691

(56) References Cited

U.S. PATENT DOCUMENTS

| | | | |
|---|---|---|---|
| 4,489,365 | * 12/1984 | Daberkoe | 361/768 |
| 5,581,126 | * 12/1996 | Moench | 357/776 |
| 5,726,860 | * 3/1998 | Mozdzen | 361/761 |
| 5,844,783 | * 12/1998 | Kojima | 361/777 |
| 5,986,893 | * 11/1999 | Leigh et al. | 361/777 |

FOREIGN PATENT DOCUMENTS

| | | |
|---|---|---|
| 5-114770 | 5/1993 | (JP) . |
| 6-334104 | 2/1994 | (JP) . |

* cited by examiner

Primary Examiner—Jeffrey Gaffin
Assistant Examiner—Kamand Cunio
(74) Attorney, Agent, or Firm—Armstrong, Westerman, Hattori, McLeland & Naughton

(57) ABSTRACT

An LSI package including an area for mounting an LSI device thereon and a plurality of lines for connecting the LSI device and external terminals. At least two of the plurality of lines, in which differential signals are transmitted and are adjacent to each other in the LSI package, have equal lengths.

3 Claims, 19 Drawing Sheets

FIG. 17

|     | TOTAL WIRING LENGTH | LINE LENGTH | WIRE LENGTH | PIN CONNECTOR NUMBER |
|---|---|---|---|---|
| #1 | 17.563 | 14.063 | 3.50 | U 3 3 |
|    | 17.576 | 15.726 | 1.85 | U 3 4 |
|    | 17.557 | 14.467 | 3.09 | T 3 3 |
|    | 17.594 | 16.154(L) | 1.44 | T 3 4 |
|    | 17.524(S) | 14.024(S) | 3.50 | R 3 3 |
|    | 17.599(L) | 15.749 | 1.85 | R 3 4 |
| #2 | 14.158 | 10.658(S) | 3.50 | U 3 1 |
|    | 14.139(S) | 12.289 | 1.85 | U 3 2 |
|    | 14.188(L) | 11.098 | 3.09 | T 3 1 |
|    | 14.151 | 12.711(L) | 1.44 | T 3 2 |
|    | 14.183 | 10.683 | 3.50 | R 3 1 |
|    | 14.155 | 12.305 | 1.85 | R 3 2 |
| #3 | 19.458 | 16.368 | 3.09 | N 3 3 |
|    | 19.427 | 17.987 | 1.44 | N 3 4 |
|    | 19.430 | 15.930(S) | 3.50 | M 3 3 |
|    | 19.468(L) | 17.618 | 1.85 | M 3 4 |
|    | 19.421(S) | 16.331 | 3.09 | L 3 3 |
|    | 19.452 | 18.012(L) | 1.44 | L 3 4 |
| #4 | 16.052 | 12.552(S) | 3.50 | N 3 1 |
|    | 16.068 | 14.218 | 1.85 | N 3 2 |
|    | 16.065 | 12.975 | 3.09 | M 3 1 |
|    | 16.028(S) | 14.588(L) | 1.44 | M 3 2 |
|    | 16.079(L) | 12.579 | 3.50 | L 3 1 |
|    | 16.050 | 14.200 | 1.85 | L 3 2 |

FIG. 18

|  | TOTAL WIRING LENGTH | LINE LENGTH | WIRE LENGTH | PIN CONNECTOR NUMBER |
|---|---|---|---|---|
| # 5 | 22.051 | 18.961 | 3.09 | J 3 3 |
|  | 21.915(S) | 20.475 | 1.44 | J 3 4 |
|  | 22.042 | 18.542(S) | 3.50 | H 3 3 |
|  | 22.079 | 20.229 | 1.85 | H 3 4 |
|  | 22.007 | 18.917 | 3.09 | G 3 3 |
|  | 22.082(L) | 20.642(L) | 1.44 | G 3 4 |
| # 6 | 24.395(L) | 20.895 | 3.50 | F 3 3 |
|  | 24.321 | 22.471 | 1.85 | F 3 4 |
|  | 24.385 | 21.295 | 3.09 | E 3 3 |
|  | 24.312(S) | 22.872(L) | 1.44 | E 3 4 |
|  | 24.392 | 20.892(S) | 3.50 | D 3 3 |
|  | 24.322 | 22.472 | 1.85 | D 3 4 |
| # 7 | 20.312 | 16.812(S) | 3.50 | G 3 1 |
|  | 20.327 | 18.477 | 1.85 | G 3 2 |
|  | 20.324 | 17.234 | 3.09 | F 3 1 |
|  | 20.329(L) | 18.8889(L) | 1.44 | F 3 2 |
|  | 20.327 | 16.827 | 3.50 | E 3 1 |
|  | 20.310(S) | 18.460 | 1.85 | E 3 2 |
| # 8 | 18.285(L) | 15.195 | 3.09 | J 3 1 |
|  | 18.172 | 16.732(L) | 1.44 | J 3 2 |
|  | 18.147(S) | 14.647(S) | 3.50 | H 3 1 |
|  | 18.213 | 16.363 | 1.85 | H 3 2 |

FIG. 19

|  | TOTAL WIRING LENGTH | LINE LENGTH | WIRE LENGTH | PIN CONNECTOR NUMBER |
|---|---|---|---|---|
| #9 | 17.413(S) | 13.913(S) | 3.50 | P 3 3 |
|  | 17.500(L) | 15.650(L) | 1.85 | P 3 4 |
|  | 17.457 | 14.367 | 3.09 | P 3 2 |
| #10 | 19.184(S) | 15.684(S) | 3.50 | K 3 3 |
|  | 19.185 | 17.375(L) | 1.85 | K 3 4 |
|  | 19.194(L) | 16.104 | 3.09 | K 3 2 |
| #11 | 23.791 | 20.291(S) | 3.50 | C 3 3 |
|  | 23.796(L) | 21.946(L) | 1.85 | D 3 2 |
|  | 23.745(S) | 20.655 | 3.09 | C 3 2 |
| #12 | 17.486(S) | 16.046(L) | 1.44 | F 3 0 |
|  | 17.554(L) | 14.054(S) | 3.50 | E 3 0 |

LSI PACKAGE WITH EQUAL LENGTH TRANSMISSION LINES

BACKGROUND OF THE INVENTION

1. Field of the Invention

The present invention generally relates to an LSI package, and particularly relates to an LSI package including an LSI device operating at a higher clock frequency.

Recent LSI devices tend to operate at higher frequency and with higher electrical consumption. Accordingly, there is a need for packages for mounting the LSI devices thereon, or LSI packages, which can be used with such LSI devices. Thus, the LSI packages are modified as follows.

First, in order to stabilize an electric current supply, the LSI package is formed in a multilayer structure with an inner layer provided with a source/ground plane. Secondly, in order to reduce an inductance of source/ground lines, the source/ground lines are provided so as to be short in length and broad in width. Thirdly, in order to achieve a 50 Ω impedance matching, gaps between layers are adjusted by providing planes on layers above and below wiring layers. Finally, in order to reduce mutual inductance and crosstalk, gaps between signal lines are widened so that the signal lines do not interfere with each other.

2. Description of the Related Art

Now an LSI package of the related art will be described in detail with reference to FIGS. 1 and 2. An LSI package 1 shown in FIGS. 1 and 2 is a double-layer package including an upper layer 2 (shown in FIG. 1) and a lower layer 3 (shown in FIG. 2). FIGS. 1 and 2 show ⅛ of the whole pattern of the LSI package 1.

As shown in FIGS. 1 and 2, through-hole lands 4 are formed in a matrix form on both the upper layer 2 and the lower layer 3. The through-hole lands 4 are connected to external terminals via through-holes. The external terminals are provided with, for example, bumps. With the structure described above, the LSI package 1 may be used as a BGA (Ball Grid Array) type package.

Also, the upper layer 2 and the lower layer 3 are provided with a number of lines 5. Each of the lines 5 is connected to one of the external terminals via a through-hole at one end, and to an electrode pad 6 on the other end. The electrode pads 6 are formed on the upper layer 2 and the lower layer 3 at positions facing a semiconductor chip (not shown). The electrode pads 6 are electrically connected to the semiconductor chip using wires.

Now, the lines 5 will be described in detail. In the related art, the relationship between the lengths of the lines 5 on either the upper layer 2 or the lower layer 3, or the lines 5 on both the upper layer 2 and the lower layer 3, was not of a great interest. The wiring pattern was determined so as to facilitate the forming process of the lines 5.

However, for source lines and for ground/source lines, which are labeled a–g in FIGS. 1 and 2, the line lengths were shortened for the sake of electrical feature and the line widths were broadened as shown by the line labeled g in FIG. 2. Also, impedance matching was achieved by a multilayer package provided with a signal-transmitting layer held between the source planar layer and the ground planer layer.

In the related art, improvement of electrical characteristics of the LSI package 1 has focused on improvement of the LCR characteristics or the 50 Ω matching of the characteristic impedance according to the modifications described above. Thus, the LCR characteristics, the impedance matching of the LSI package, and crosstalk problems have been improved. However, there is still a need for reducing the noise produced by the mismatch of transmission times between differential signals.

Also, when the above-described modifications are applied to the recent LSI devices having a clock frequency of over 1 GHz, there is a problem that when the LSI device is mounted on the LSI package 1, the LSI device (semiconductor device) does not operate.

SUMMARY OF THE INVENTION

Accordingly, it is a general object of the present invention to provide an LSI package which can solve the problems described above.

It is another and more specific object of the present invention to provide an LSI package which can achieve an improvement in the electrical characteristics even when an LSI device, which uses a higher clock frequency, is mounted on the LSI package.

It is still another object of the present invention to provide an LSI package, which can reduce the transmission time lag between differential signals, thus reducing the noise and improving electrical characteristics.

In order to achieve the above objects, an LSI package includes:

an area for mounting an LSI device thereon; and
a plurality of lines for connecting the LSI device and external terminals,
wherein at least two of the plurality of lines, in which differential signals are transmitted and are adjacent to each other in the LSI package, have equal lengths.

Further, the LSI package includes a multilayer structure having layers provided with the plurality of lines thereon, wherein the lines having equal lengths are provided on one of the layers. Also, the LSI package may include a multilayer structure having layers provided with the plurality of lines thereon, wherein the lines having equal lengths are provided on different ones of the layers.

It is yet another object of the present invention to provide an LSI package which can reduce the transmission time lag between differential signals including any loss at wires, thus improving electrical characteristics.

In order to achieve the above object, the plurality of lines connected to the external terminals are respectively connected to an LSI device using wires so that a plurality of interconnections are formed between the LSI device and the external terminals, the lengths of the interconnections being equal.

It is yet another object of the present invention to provide an LSI package which can prevent any crosstalk between a pair of lines.

In order to achieve to above object, the LSI package further includes a double-layer structure having an upper layer and a lower layer provided with the plurality of lines thereon, wherein the lines provided on the upper layer and the lines provided on the lower layer are offset by half a pitch, and wherein, when a pair of lines having equal lengths for transmitting differential signals are provided on either one of the upper layer and the lower layer, a line on the other one of the upper layer and the lower layer positioned between the pair of lines is used as one of terminating resistance line and a power supply/ground line.

BRIEF DESCRIPTION OF THE DRAWINGS

FIGS. 17 to 19 are charts indicating total wiring length, line length, wire length and pin connector number for lines formed on the LSI package shown in FIGS. 3 and 4.

DETAILED DESCRIPTION OF THE PREFERRED EMBODIMENTS

In the following, a principle and an embodiment of the present invention will be described with reference to the accompanying drawings.

Figure 1:
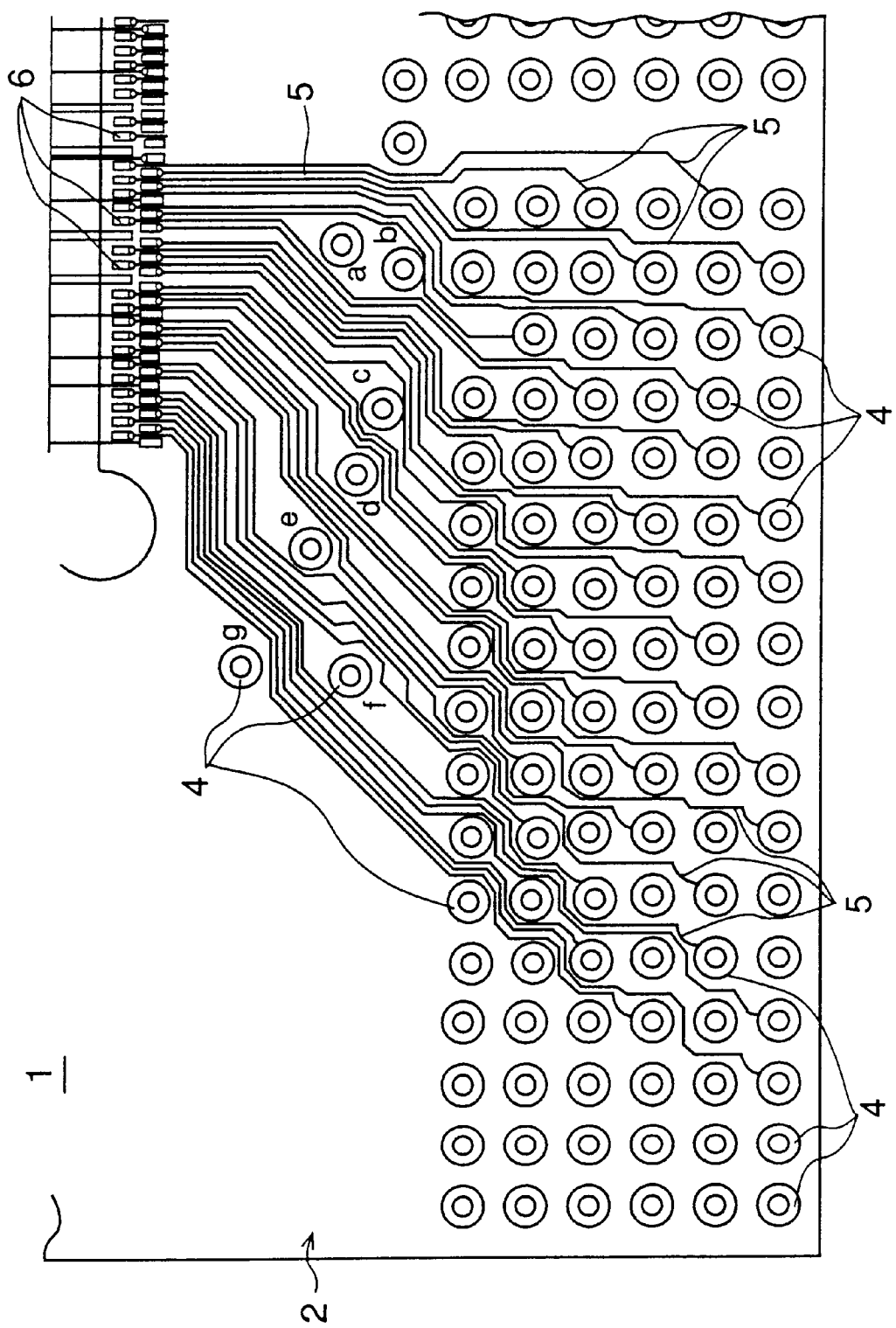
FIG. 1 is a diagram showing an upper layer of an LSI package of the related art.
Figure 2:
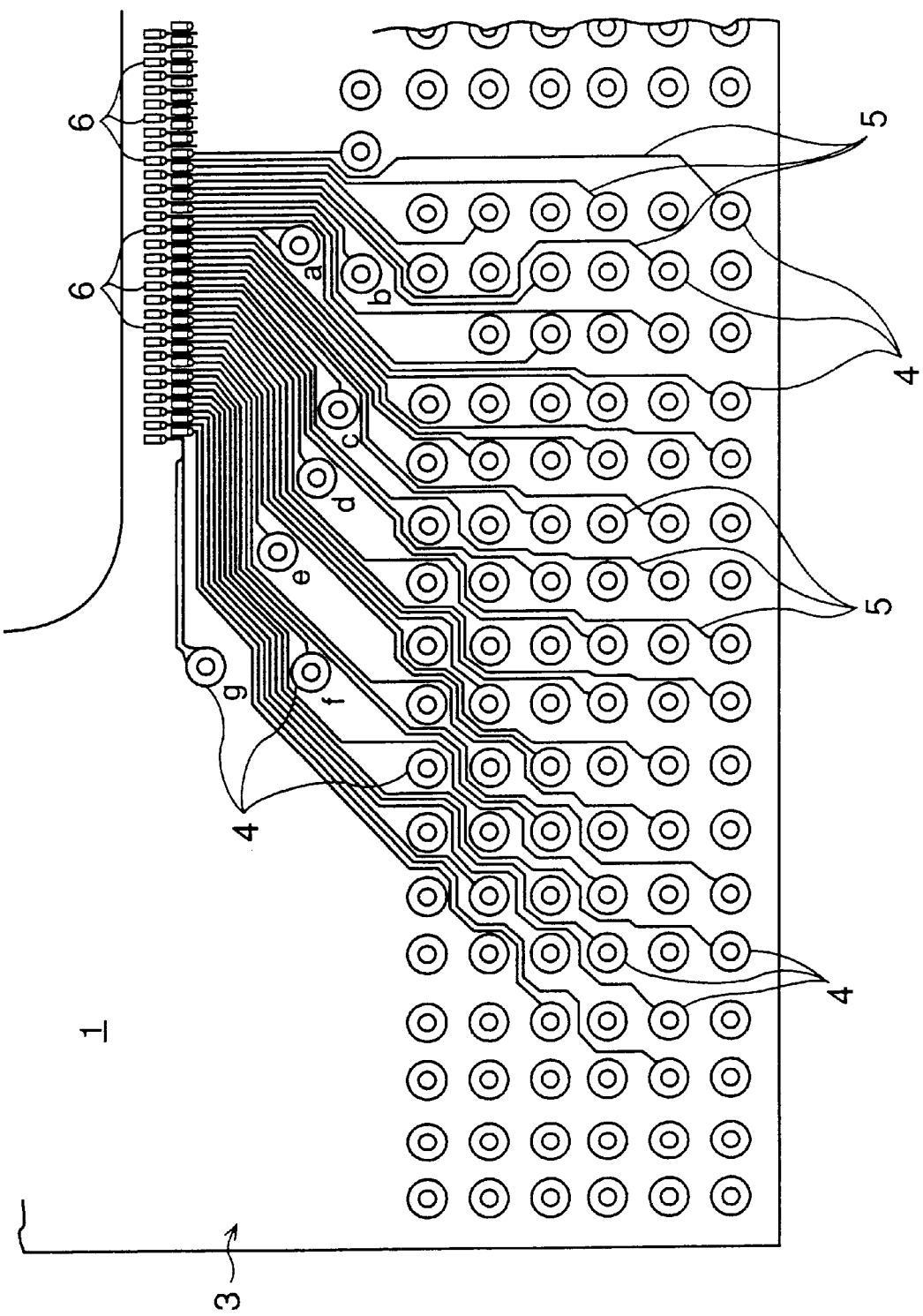
FIG. 2 is a diagram showing a lower layer of the LSI package of the related art.
Figure 3:
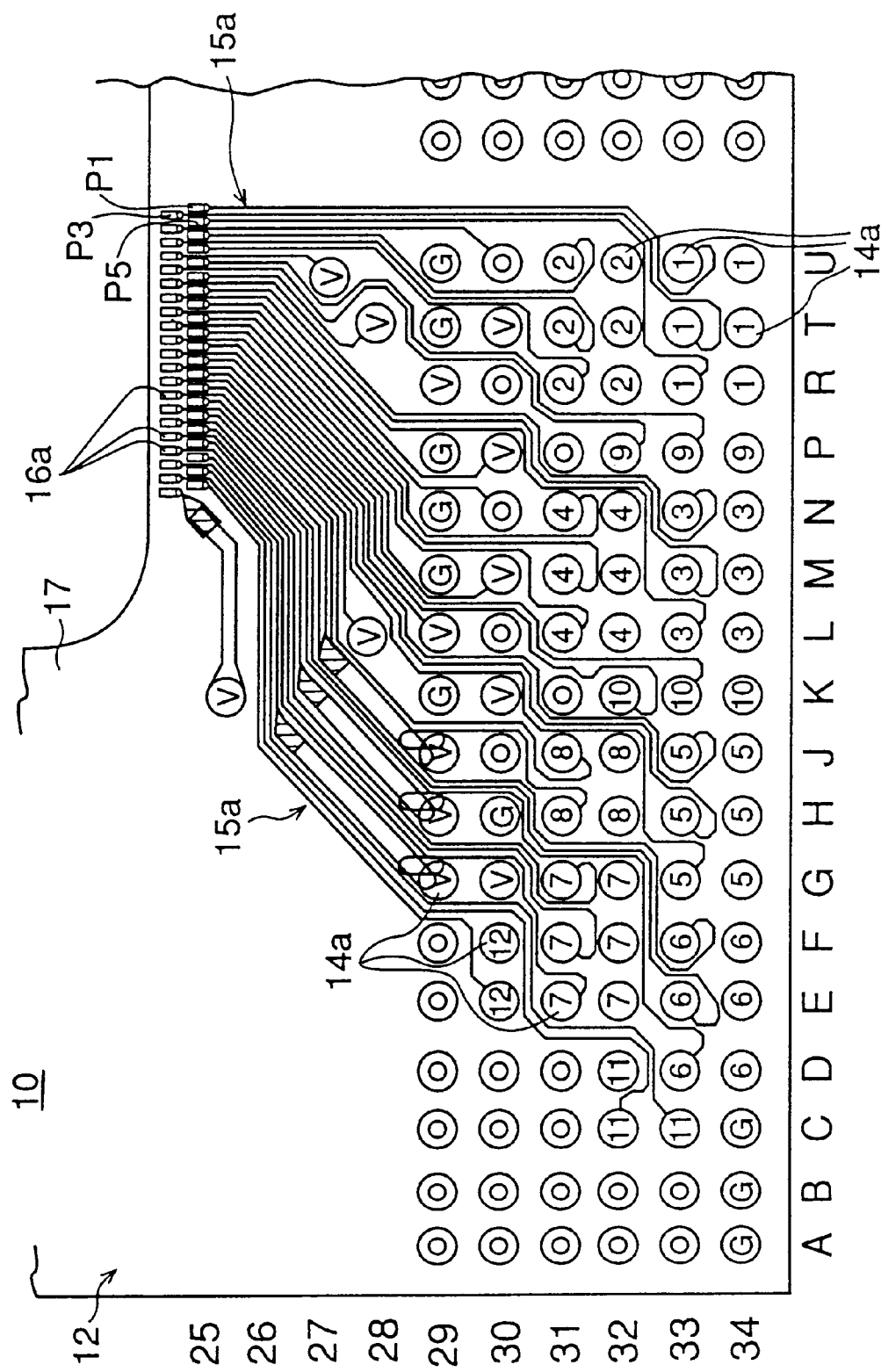
FIG. 3 is a diagram showing a wiring structure of an upper layer of an LSI package of the present invention.
Figure 4:
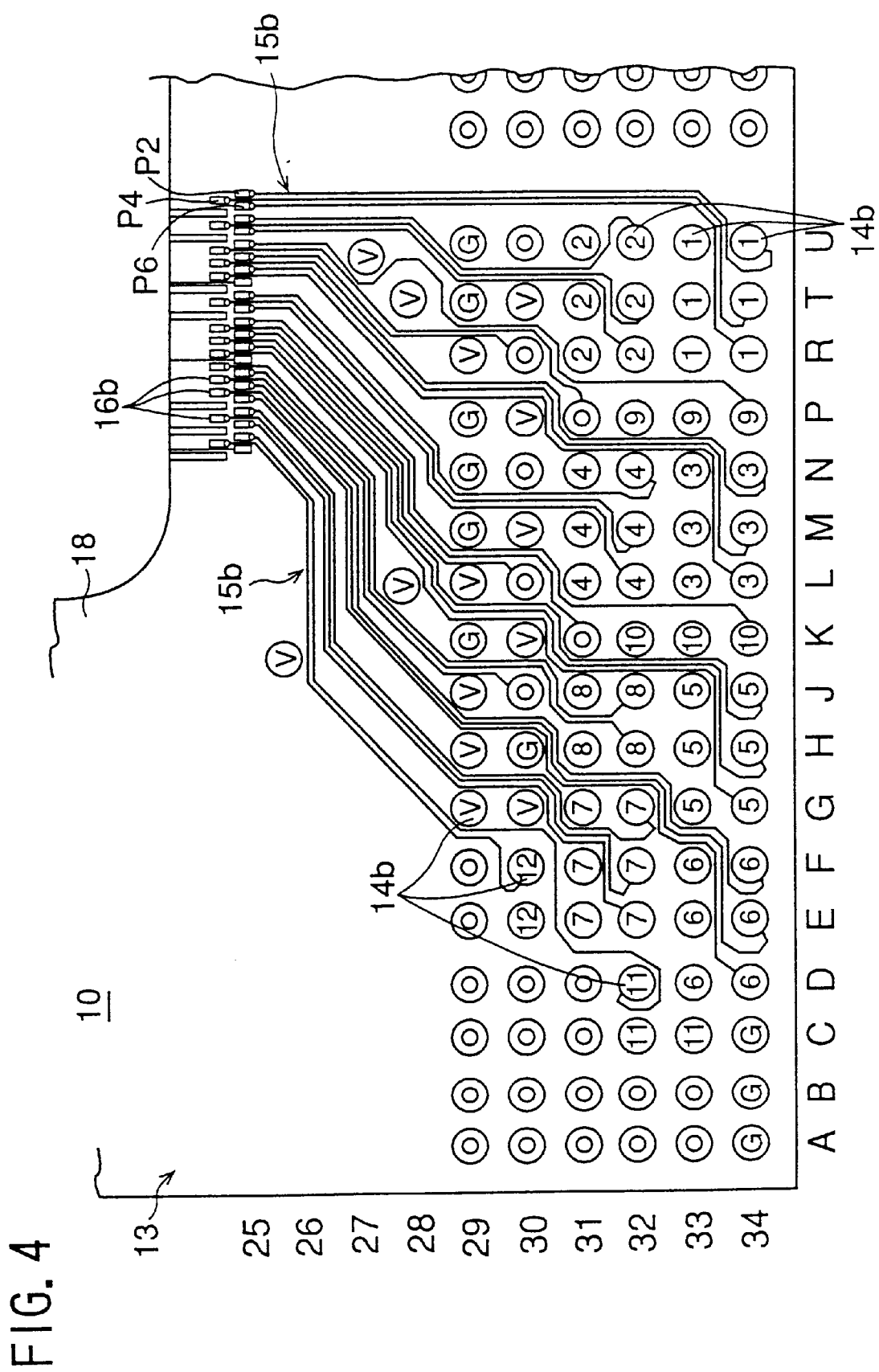
FIG. 4 is a diagram showing a wiring structure of a lower layer of the LSI package of the present invention.
Figure 5:
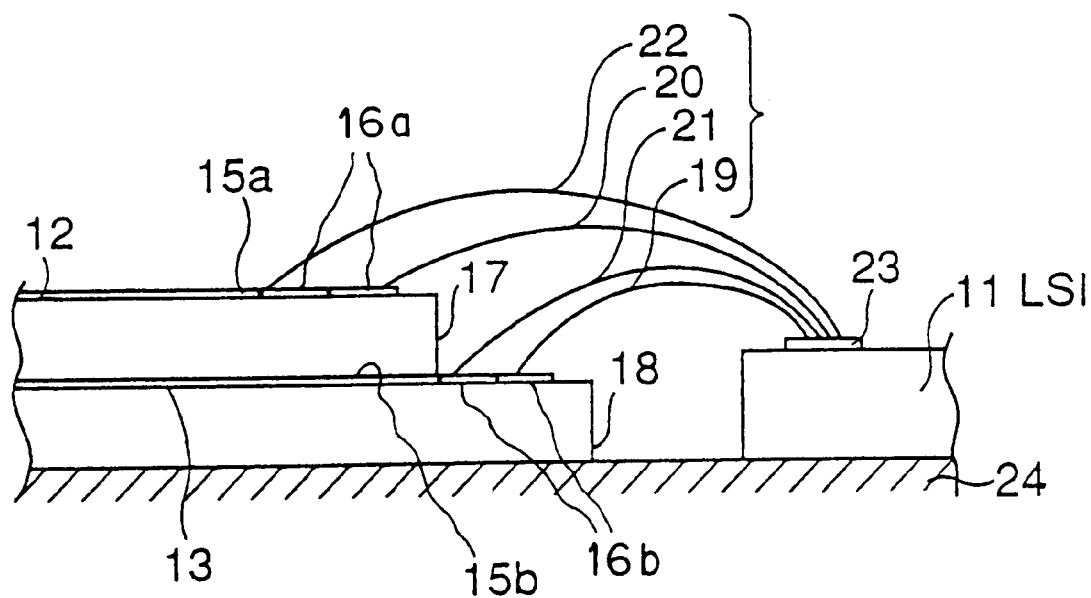
FIG. 5 is a side view partly showing the LSI package of a embodiment of the present invention.

FIGS. 3 to 8 are diagrams showing an LSI package 10 having a wiring structure of an embodiment of the present invention. The LSI package 10 according to the present invention has a multilayer structure. As shown in FIG. 5, in the present embodiment, the LSI package 10 is a double-layer package including an upper layer 12 and a lower layer 13. FIG. 3 is a plan view of the upper layer 12 and FIG. 4 is a plan view of the lower layer 13. Also in FIGS. 3 and 4, only ⅛ of the whole pattern of the LSI package 10 is shown for convenience sake of illustration.

The upper layer 12 and the lower layer 13 are provided on boards formed of an insulating member, respectively. The boards are fixed on a base 24 of the LSI package 10. The upper layer 12 and the lower layer 13 are formed such that their surfaces are provided with lines 15a and 15b. Also, openings 17 and 18 in which an LSI chip (semiconductor chip) 11 is mounted are formed at the central part of the upper layer 12 and the lower layer 13.

The lines 15a, 15b include through-hole lands 14a,14b at one end and electrode pads 16a,16b at the other end, both being formed in an integrated manner. The through-hole lands 14 are formed in the upper layer 12 and in the lower layer 13 in a matrix form. The through-hole lands 14 are connected to external terminals via through-holes. The external terminals are provided with, for example bumps, by which the LSI package 10 may be used as a BGA (Ball Grid Array) type package.

In the present embodiment, each through-hole land 14a, 14b is specified by providing addresses 25–34 in a longitudinal direction and addresses A–U in a lateral direction. Also, since the through-hole lands 14a, 14b are in a one-to-one relationship with the lines 15a, 15b, the lines 15a, 15b may also be specified by the above addresses.

Now, referring to FIGS. 6A, 6B, 7 and 8, the structure of the electrode pads 16a and 16b, which are formed at end parts of each line 15, will be described.

Figure 8:
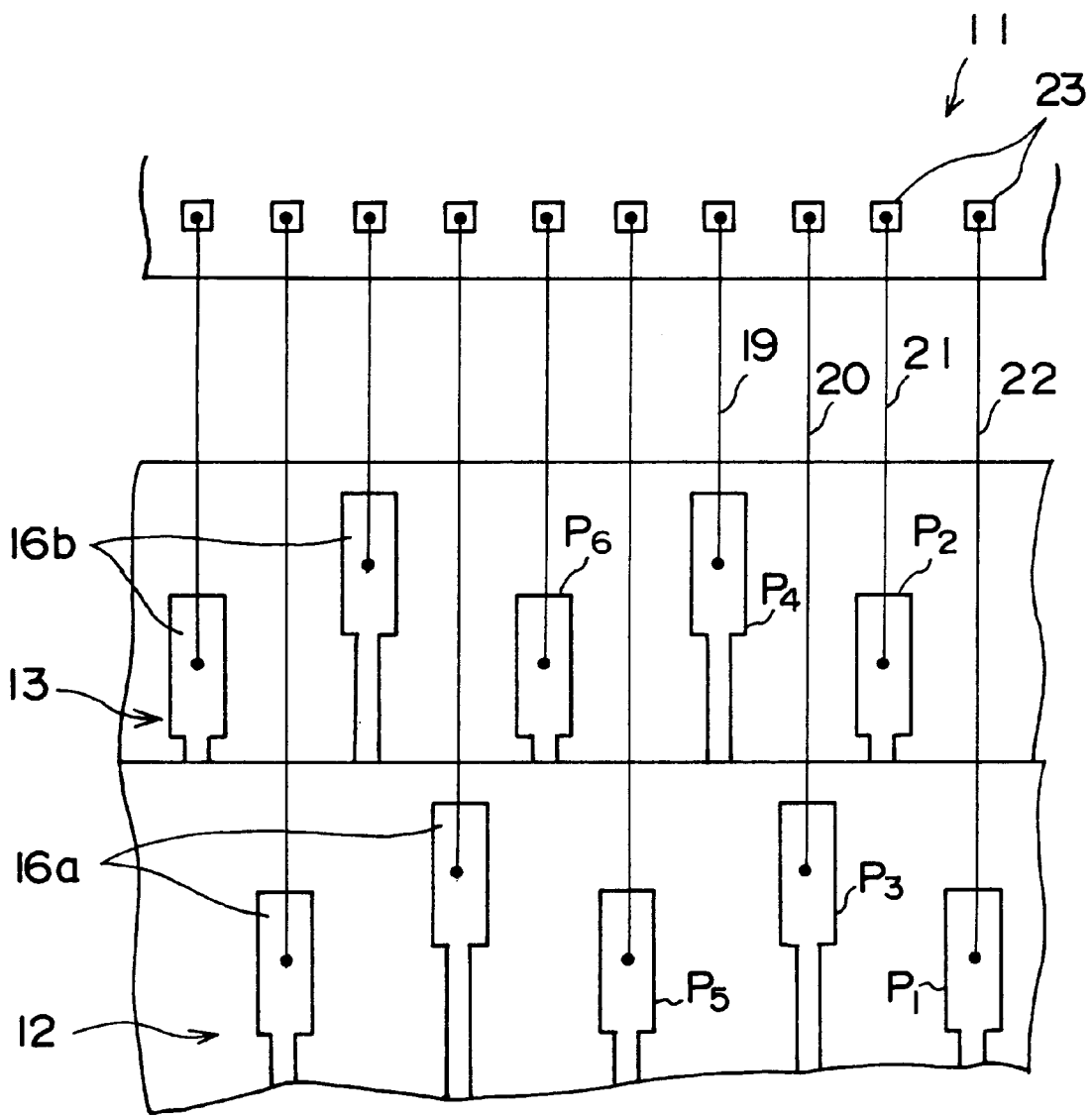
FIG. 8 is a diagram showing positioning of wires between the electrode pads and a semiconductor chip of the LSI package of the embodiment of the present invention.

The electrode pads 16a and 16b are provided in parallel near the openings 17 and 18. Also, as shown in FIG. 8, the electrode pads 16a and 16b are provided so as to oppose semiconductor chip pads 23 formed on an LSI chip 11. The electrode pads 16a and 16b are electrically connected to the pads 23 via wires 19–22.

Figure 6A:
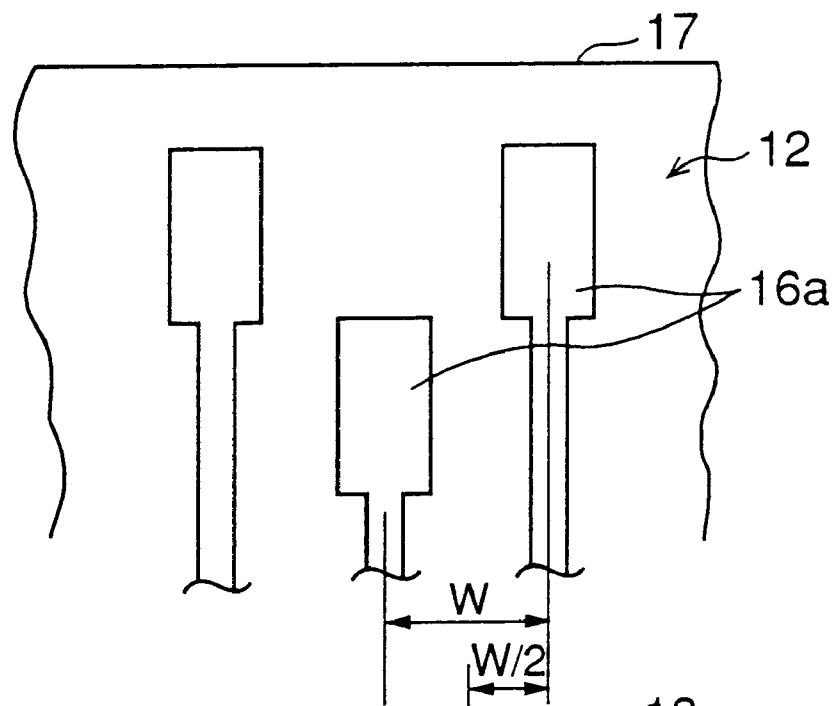
FIGS. 6A and 6B are diagrams showing positioning of electrode pads formed on the LSI package of the embodiment of the present invention.
Figure 6B:
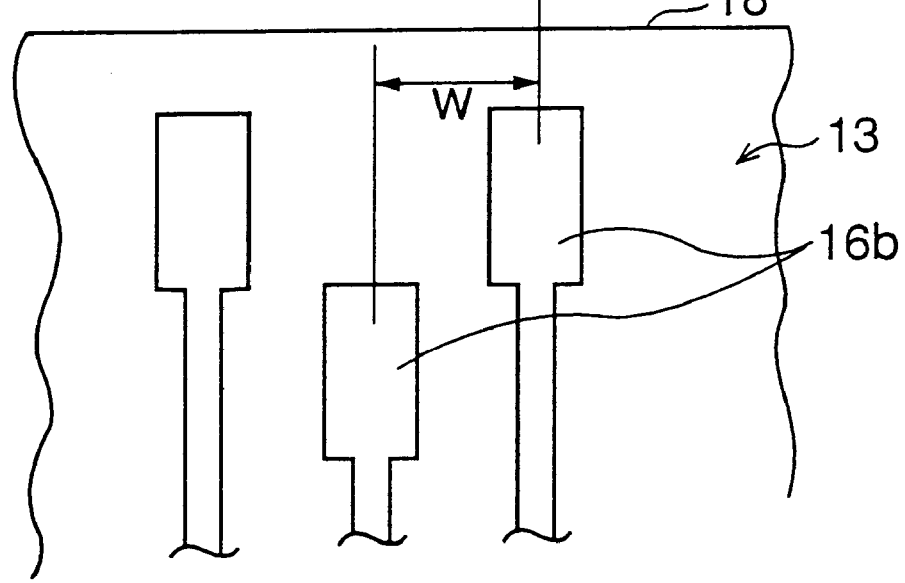

FIG. 6A shows an enlarged view of the electrode pads 16a formed on the upper layer 12 and FIG. 6B shows an enlarged view of the electrode pads 16b formed on the lower layer 13.

As shown in FIGS. 6A and 6B, the electrode pads 16a are formed with a pitch (W), a center to center distance on the upper layer 12 and the electrode pads 16b are formed with the same pitch (W) on the lower layer 13. Also, adjacent electrode pads 16a, 16b have different levels in a vertical direction, such that the electrode pads 16a, 16b form saw-toothed structures on the upper layer 12 and on the lower layer 13, respectively.

Figure 7:
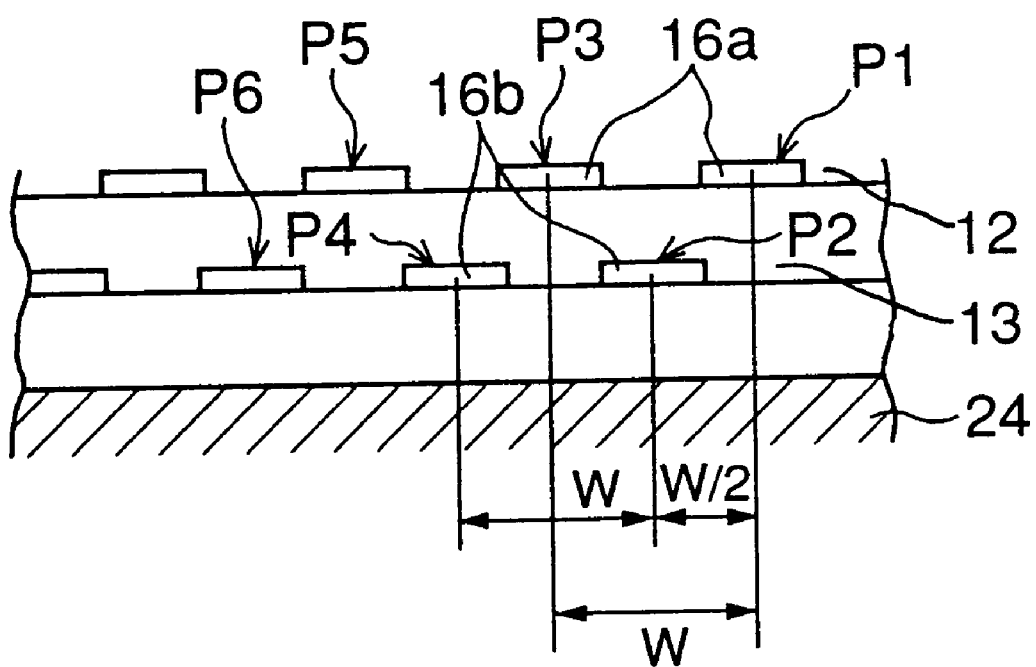
FIG. 7 is a side view showing positioning of electrode pads formed on the LSI package of the embodiment of the present invention.

As shown in FIGS. 7 and 8, an electrode pad formed on one of the layers is provided between a pair of electrode pads formed on the other layer. In FIG. 3, the rightmost electrode pad 16a on the upper layer 12 is labeled P1 and adjacent electrode pads are successively labeled P3, P5 and the like. Similarly, in FIG. 4, the rightmost electrode pad 16b on the lower layer 13 is labeled P2 and adjacent electrode pads are successively labeled P4, P6 and the like.

Here, considering the above-described other layer to be the upper layer 12, and the pair of electrode pads to be P1 and P3, the electrode pad P2 formed on the lower layer 13 will be positioned between the pair of electrode pads P1 and P3. Accordingly, as shown in FIG. 8, the wires 19–22 can be provided with high density.

In the following, a wiring structure of the lines 15a and 15b, which forms an important part of the present embodiment, will be described.

As shown in FIGS. 3 and 4, the through-hole lands 14a and 14b are labeled with numbers 1–12 and characters V and G. The lines 15a, 15b connected to the through-hole lands 14a,14b labeled with numbers 1–12 are signal lines. Also, the lines 15a,15b connected to the through-hole lands 14a, 14b labeled V are source lines. Further, the lines 15a, 15b connected to the through-hole lands 14a, 14b labeled G are ground lines.

For the signal lines, the lines labeled with the same number form one group in which the lengths of the lines 15a, 15b are equal. For example, there are six through-hole lands 14a, 14b which are labeled "1", which means that there are six corresponding lines 15a, 15b. These six lines 15a, 15b form a group of equal-length lines. In other words, the lines represented by U33, U34, T33, T34, R33 and R34 have the same length (equal length). Here, the group of equal-length lines, which are labeled "1", is referred to as a "#1 group" and other groups labeled "2" to "12" are similarly referred to as a "#2 group" to a "#12 group", respectively.

In the present embodiment shown in FIGS. 3 and 4, groups of six equal-length lines include the "#1 group", "#2 group", "#3 group", "#4 group", "#5 group", "#6 group" and "#7 group".

Also, the "#8 group" is a group of four equal-length lines. Further, groups of three equal-length lines include the "#9 group", "#10 group" and "#11 group". The "#12 group" is a group of two equal-length lines. In the figure, the through-hole lands 14a,14b, which are not labeled, do not form a group of equal-length lines.

In the present embodiment, the LSI chip 11, which uses a high clock frequency (e.g., 1 GHz), is mounted on the LSI package 10 and differential signals are supplied to a pair of adjacent lines 15a and 15b in each group. Note that, as described above, the lengths of the lines 15a and 15b in each group (#1 group–#12 group) are equal. Then, since the lengths of the pair of lines 15a and 15b through which the differential signals are transmitted are equal, the transmission time lag between the differential signals may be reduced. Therefore, noise in the differential signals will be reduced and the electrical characteristics will be sufficiently improved.

Now, a layout of lines 15a and 15b within each group will be described.

As shown above, from an electrical characteristic point of view, the lines 15a and 15b may be categorized into the signal lines for transmitting the differential signals, the source lines for supplying voltages and the ground lines to be grounded. Here, the #1 group is taken as an example. When providing the equal-length lines on the double-layered LSI package 10, two lines for transmitting the differential signals may either be provided on the same layer or on different layers. In either case, in order to reduce the noise, at least the lengths of the lines for transmitting the differential signals need to be the equal.

When the two lines for transmitting the differential signals are provided on the same layer (i.e., only on the upper layer 12 or only on the lower layer 13), the lines corresponding to adjacent pins on the layer (e.g., U33 and T33) are made to be equal-length lines. Also, when the two lines for transmitting the differential signals are provided on different layers (i.e., one on the upper layer 12 and the other on the lower layer 13), the lines provided on each layer 12 and 13 (e.g., U33 and U34) are made to be equal-length lines.

However, when providing the two lines for the differential signals on the same layer, one line on the other layer is positioned between the two lines for differential signals. That is to say, with the wiring structure of the present embodiment, the lines 15a formed on the upper layer 12 and the lines 15b formed on the lower layer 13 are formed so as to be offset by half a pitch.

This will be described with reference to FIG. 7. Lines connected to pads P1 and P3 formed on the upper layer 12 are lines for the differential signals. The line connected to pad P2 formed on the lower layer 13 exists between the two lines connected to pads P1 and P3. Therefore, by using the line connected to pad P2 formed on the lower layer 13 as a line for end resistance or source/ground, the noise may be further reduced since the two lines P1 and P3 are electromagnetically shielded.

Now, a case is considered where six (or a multiple of six) equal-length lines form one group, for example, one of the #1 group–#7 group. When the two lines for the differential signals are provided on the same layer, a pair of equal-length lines may be provided on the upper layer and the lower layer, respectively (i.e., total of two pairs). In FIG. 7, the line P1 and the line P3 of the upper layer 12 form a pair of equal-length lines for the differential signals and the line P4 and the line P6 of the lower layer 13 form a pair of equal-length lines for the differential signals. The line P2 and the line P5 will be the lines for end resistance or source/ground of the upper layer 12 and the lower layer 13, respectively.

When considering the equal-length lines, the wires 19–22 have a certain effect on the electrical characteristics. Therefore, the wiring structure of the LSI package 10 needs to be determined with consideration of the length of the wires 19–22.

FIG. 8 shows a structure where the LSI package 10 includes the upper layer 12 and the lower layer 13, and the electrode pads 16a and 16b formed on each wiring layer 12 and 13 are saw-toothed. In such a structure, the lengths of the wires 19–22 are different. Therefore, when only the length of the lines 15a, 15b are equal, each connection (including wires 19–22) may have different electric characteristics resulting from the difference of the length of the wires 19–22. This may produce a noise.

In the present embodiment, the total wiring lengths, or the lengths of lines (line lengths) 15a, 15b plus the lengths of wires 19–22 (wire lengths), are determined to be equal.

This is shown in FIGS. 17 to 19. Here, a wiring is considered to be formed of a line and a wire. FIGS. 17 to 19 are charts showing wire length, line length, and total wiring length (wire length+line length) individually for each wiring. The wire lengths of the wires 20 and 22 to be connected to the electrode pads 16a formed on the upper layer 12 are greater than the wire lengths of the wires 19 and 21 connected to the electrode pads 16b formed on the lower layer 13. Therefore, the line lengths of the lines 15a formed on the upper layer 12 are determined so as to be shorter than the line lengths of the lines 15b formed on the lower layer 13.

Thus, by introducing equal total wiring lengths (i.e., line lengths plus lengths of wires 19–22), it is possible to reduce the transmission time lag including any loss at wires. Therefore, electrical characteristics are improved.

In FIGS. 3 and 4, only ⅛ of the whole pattern of 672 pins is illustrated as described above. In order to obtain the number of equal-length lines for the whole LSI package 10, every group must be multiplied by 8. That is to say, there are 7×8=56 groups of six equal-length lines (#1–#7 group), 1×8=8 groups of four equal-length lines (#8 group), 3×8=24 groups of three equal-length lines (#9–#11 group) and 1×8=8 groups of two equal-length lines (#12 group). Then, the number of two adjacent lines (pairs) for differential signals in the same layer may be obtained as follows. For a group of six equal-length lines, two pairs may be obtained, which is 2×56=112 pairs for the whole pattern. Similarly, 1×8=8 pairs for groups of four equal-length lines and 1×24=24 pairs for groups of three equal-length lines are obtained for the whole pattern. This results in 144 pairs in total.

Also, the number of two adjacent lines for differential signals in different layers may be obtained as follows. 3×56=168 pairs for groups of six equal-length lines, 2×8=16 pairs for groups of four equal-length lines, 1×24=24 pairs for groups of three equal-length lines and 1×8=8 pairs for groups of two equal-length lines are obtained for the whole pattern. This results in 216 pairs in total. By dividing the signals in half, each of the input and output can be provided with 108 pairs of the lines for differential signals. When the data and the number of the data units of the clock signals are known, the number of differential signals may be determined so as to be larger than this known number.

Figure 9:
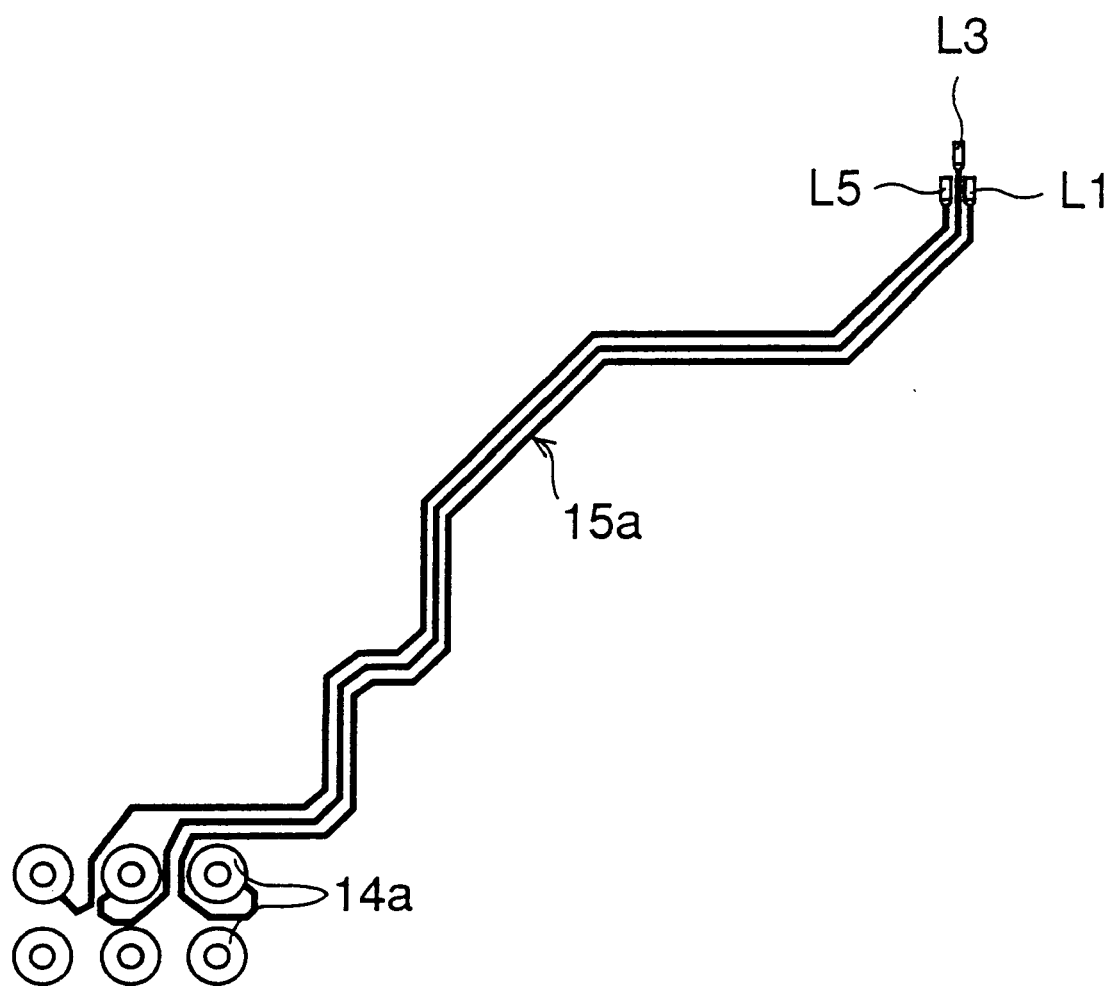
FIG. 9 is a diagram showing an example of lines having equal length, which are formed on the upper layer.
Figure 10:
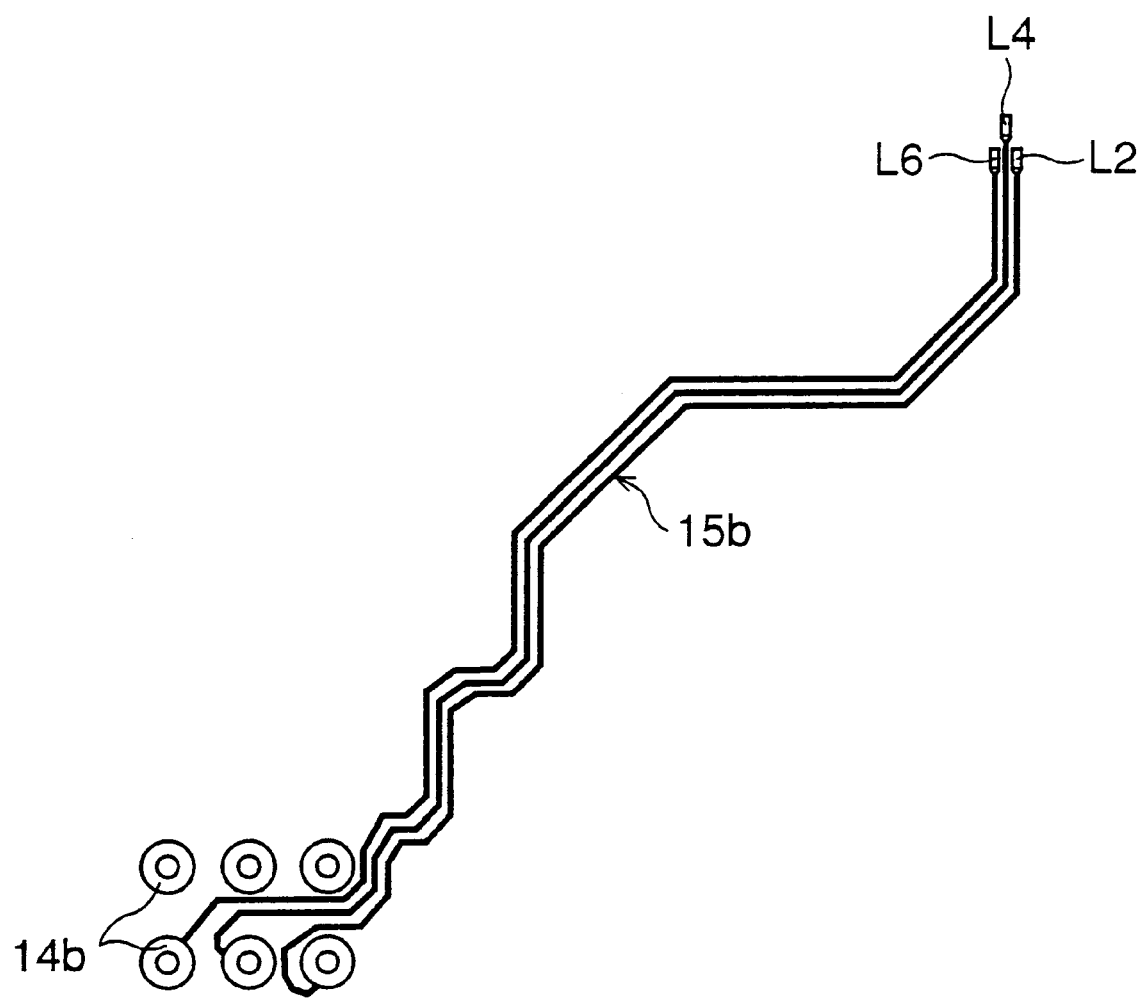
FIG. 10 is a diagram showing an example of lines having equal length, which are formed on the lower layer.

In the following, output data will be described which is obtained from a simulation using the lines for differential signals having two adjacent equal-length lines in the same layer and the lines for differential signals having two adjacent equal-length lines in different layers. FIGS. 9 and 10 show equal-length lines 15a and 15b of the group of six equal-length lines used in this simulation. FIG. 9 shows the equal-length lines 15a provided on the upper layer 12 and FIG. 10 shows the equal-length lines 15b provided on the lower layer 13.

Lines L1 and L3 are used as models for the simulation of the two adjacent equal-length lines in the same layer. The lines L1 and L3 belong to the #6 group, and correspond to F33 and E33, respectively (see FIG. 3). Here, a wire length is a length of a wire connected to a respective line and a total wiring length is a length of a wiring including the respective line. As shown in FIG. 18, the line L1 (#6 group, pin connector number F33) has aline length of 20.895 mm, a wire length of 3.50 mm and a total wiring length of 24.395 mm. The line L3 (#6 group, pin connector number E33) has a line length of 21.295 mm, a wire length of 3.09 mm and a total wiring length of 24.385 mm. The difference between the total wiring lengths of the two lines is 10 $\mu$m.

Figure 11:
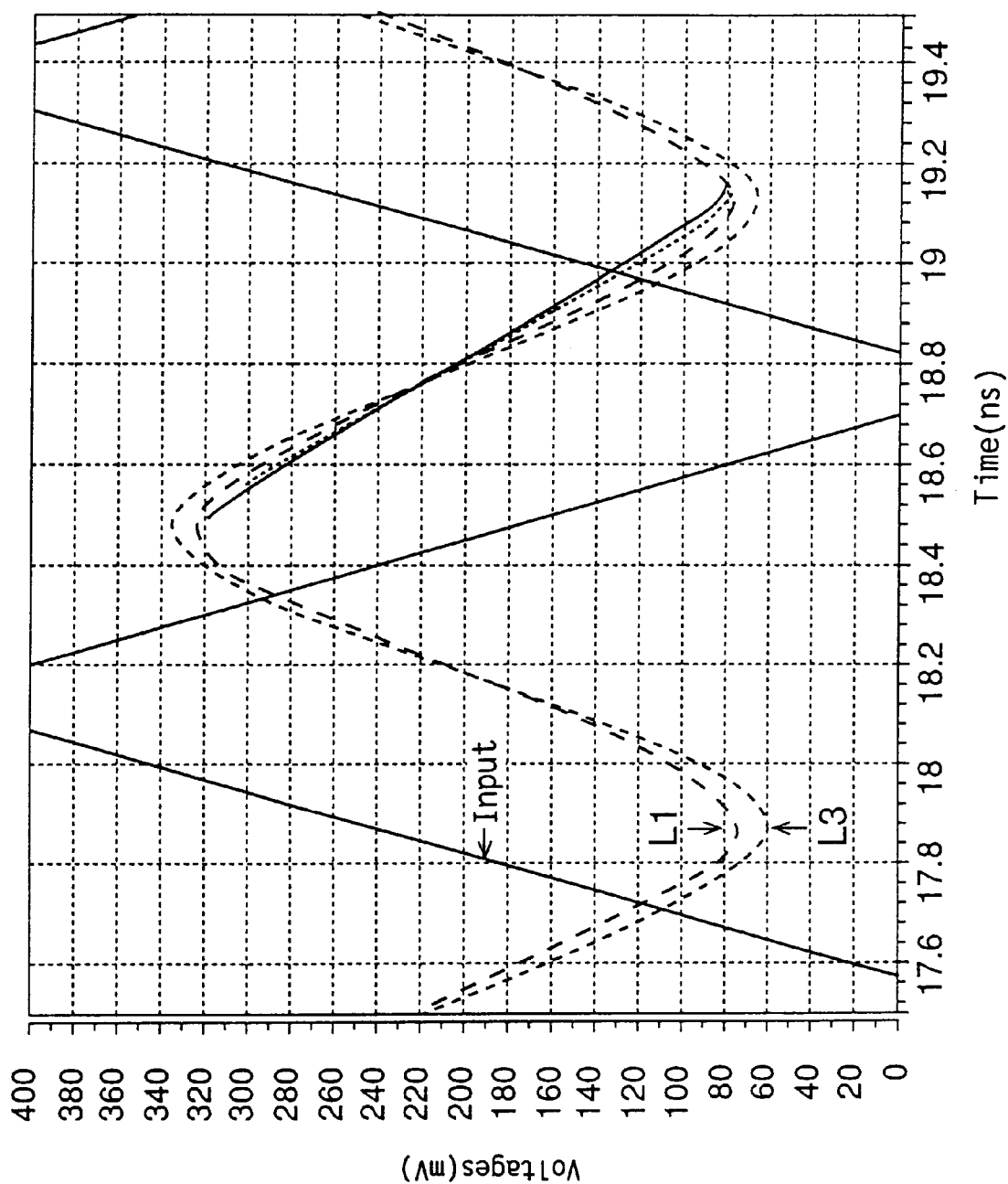
FIG. 11 is a graphical representation showing an effect of the present invention.

The result is shown in FIG. 11. FIG. 11 shows output signals output on each line when the input wave indicated as a solid line curve is input. In the figure, the vertical axis indicates voltages and the horizontal axis indicates the time. As shown in FIG. 11, the transmission difference between the two lines L1 and L3 is a relatively small value, which may be 0.83 ps. Therefore, it is shown that good transmission characteristics may be obtained when the equal-length lines are provided on the same layer.

Figure 12:
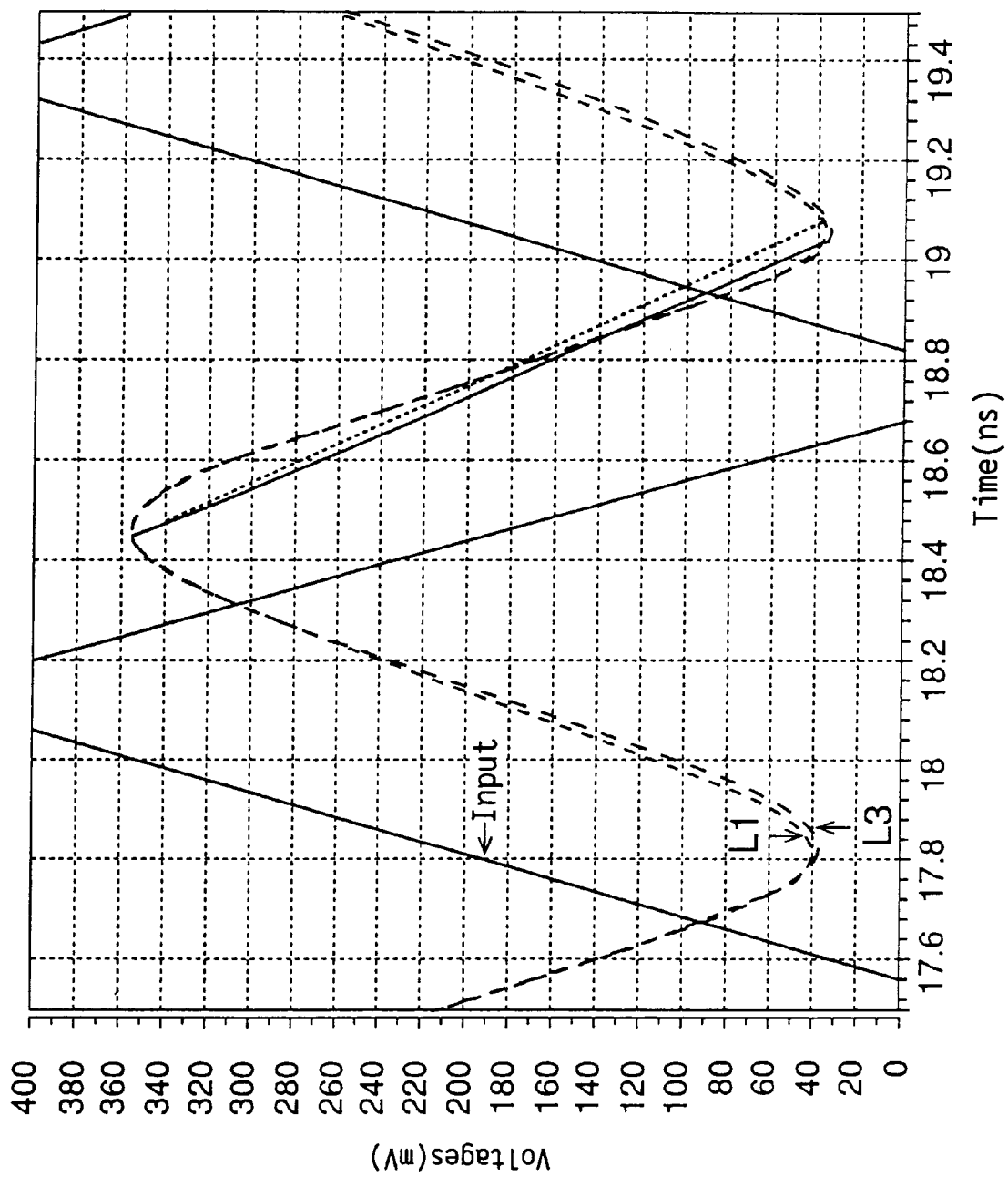
FIG. 12 is another graphical representation showing an effect of the present invention.

Lines L3 and L4 are used as models for the simulation of the two adjacent equal-length lines in different layers. The lines L3 and L4 belong to the #6 group, and correspond to E33 and E34, respectively (see FIG. 3 and 4). As shown in FIG. 18, the line L4 (#6 group, pin connector number E34) has a line length of 22.872 mm, a wire length of 1.44 mm and a total wiring length of 24.312 mm. Thus, the difference between the total wiring length of the two lines is 73 $\mu$m. The result is shown in FIG. 12. As shown in FIG. 12, the transmission difference between the lines L3 and L4 is a small value, which may be 7.20 ps. Therefore, it is shown that good transmission characteristics may be obtained even when the equal-length lines are provided on different layers.

Figure 13:
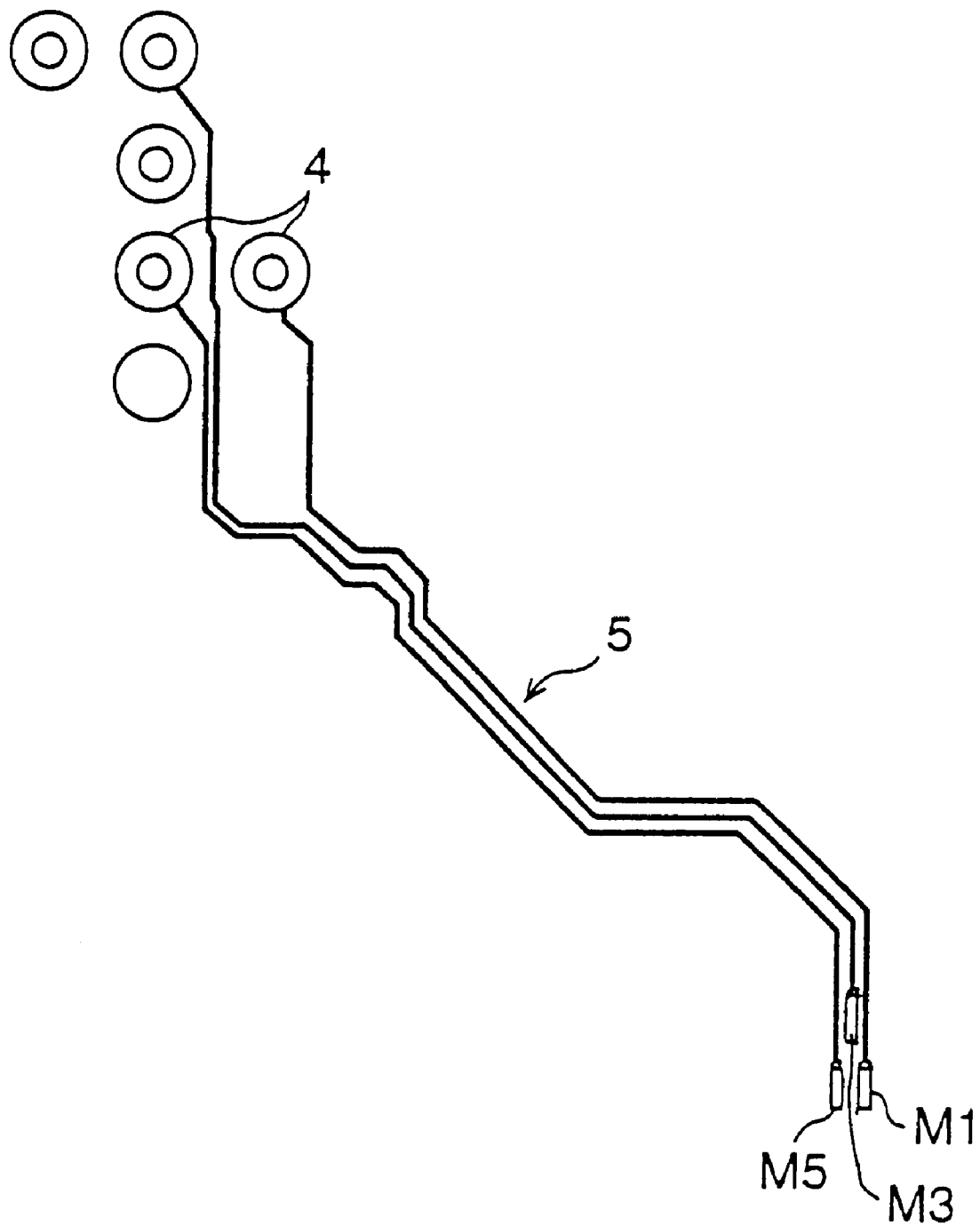
FIG. 13 is a diagram showing an example of lines which are formed on the upper layer of the LSI package according to the related art.
Figure 14:
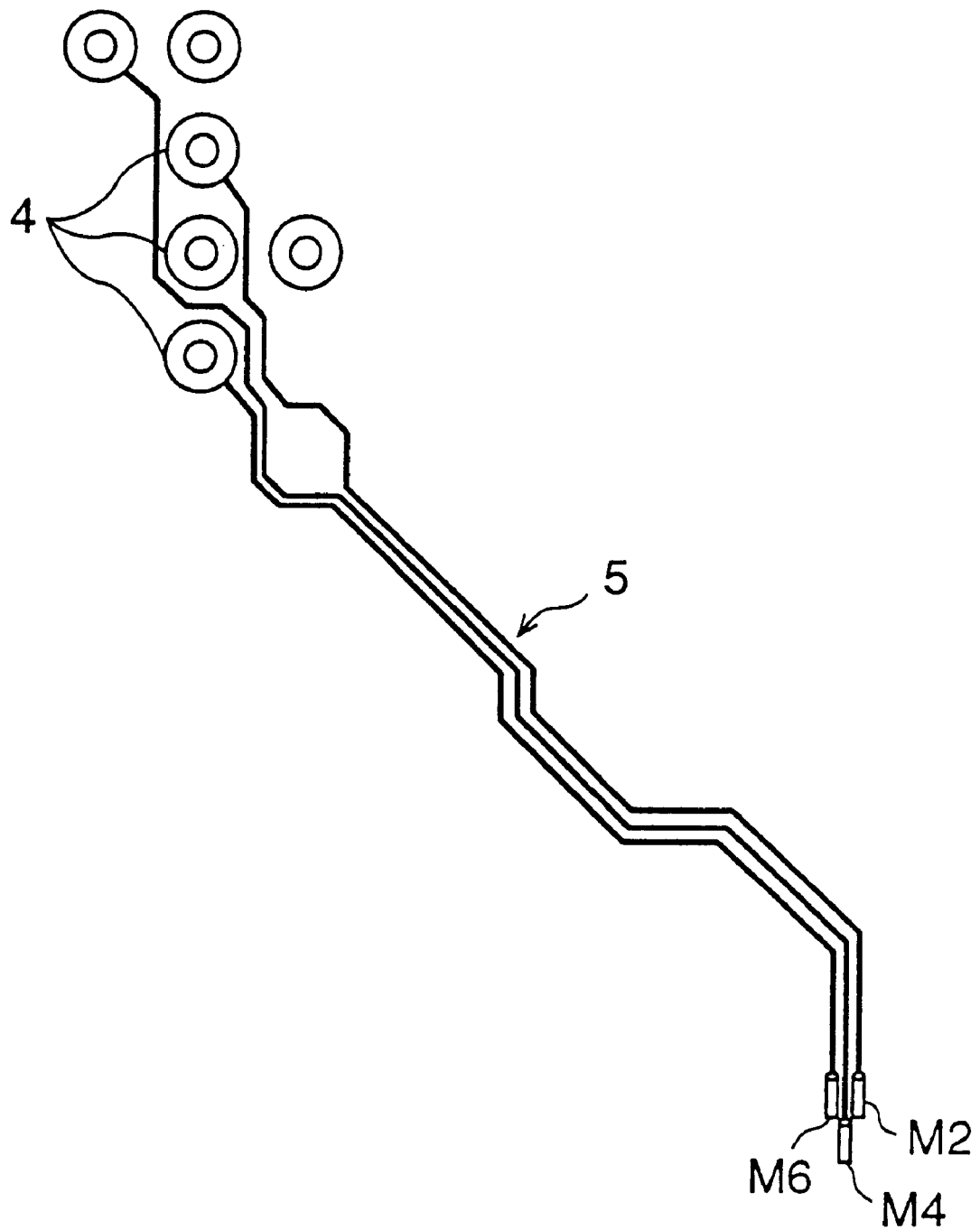
FIG. 14 is a diagram showing an example of lines which are formed on the lower layer of the LSI package according to the related art.

In the following, as a comparison, output data will be described which results from the simulation using the lines for differential signals not formed as equal-length lines in the same layer and the lines for differential signals not formed as equal-length lines in different layers. FIGS. 13 and 14 show models of the upper and lower layers provided with lines not formed as equal lines, which are used in the simulation. FIG. 13 shows the lines 5 provided on the upper layer 12 and FIG. 14 shows the lines 5 provided on the lower layer 13.

Figure 15:
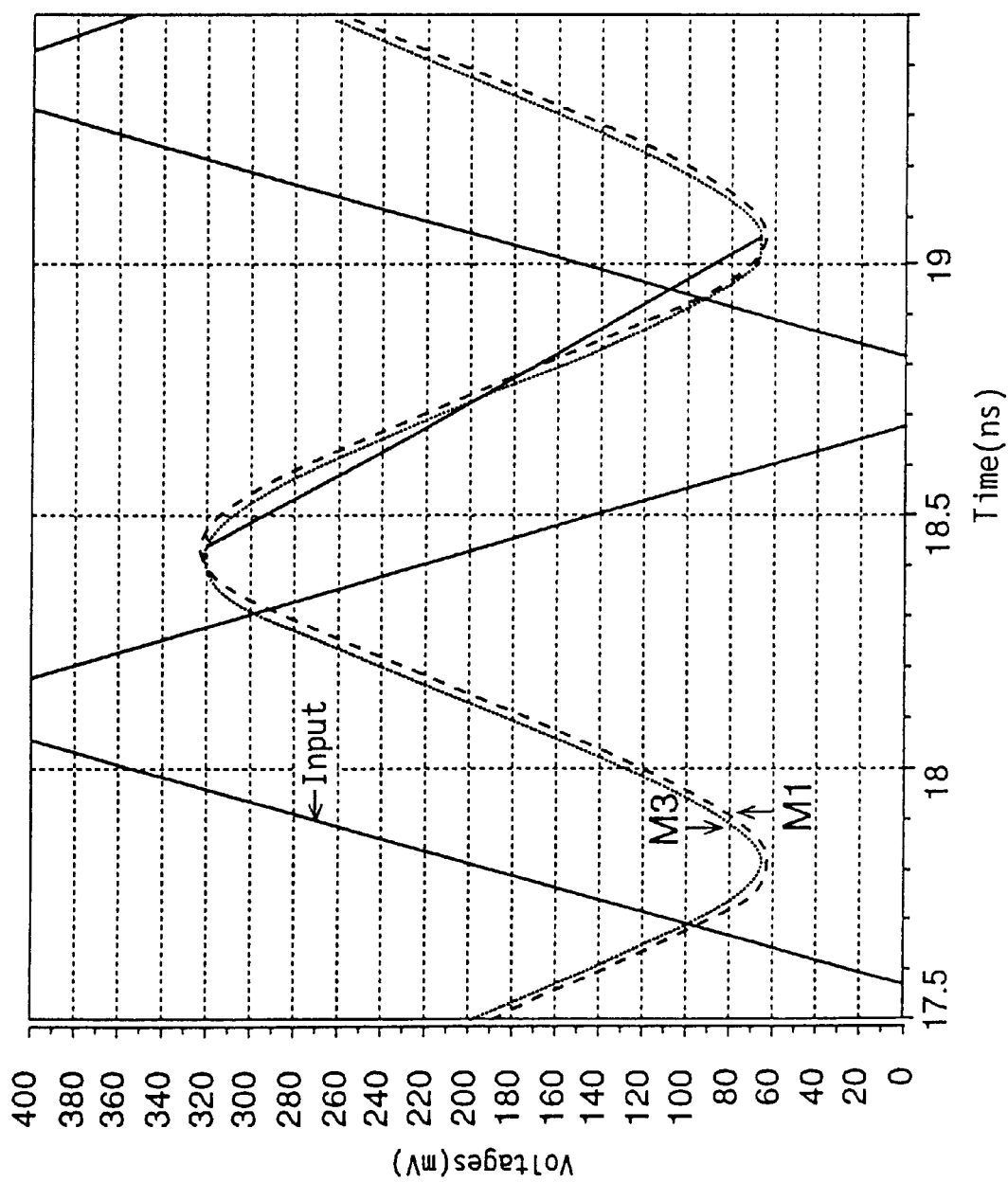
FIG. 15 is a graphical representation showing electrical characteristics of the lines according to the related art.

Lines M1 and M3 are used as models for the simulation of the two adjacent lines in the same layer. The line M1 has a line length of 12.9 mm, a wire length of 3.395 mm and the total wiring length of 16.295 mm. The line M3 has a line length of 16.444 mm, a wire length of 3.805 mm and a total wiring length of 20.249 mm. The difference between the total wiring lengths of the two lines M1 and M3 is 3.954 mm. FIG. 15 shows the result of this simulation. As shown in FIG. 15, the transmission difference between the two lines M1 and M3 is 12.50 ps.

Figure 16:
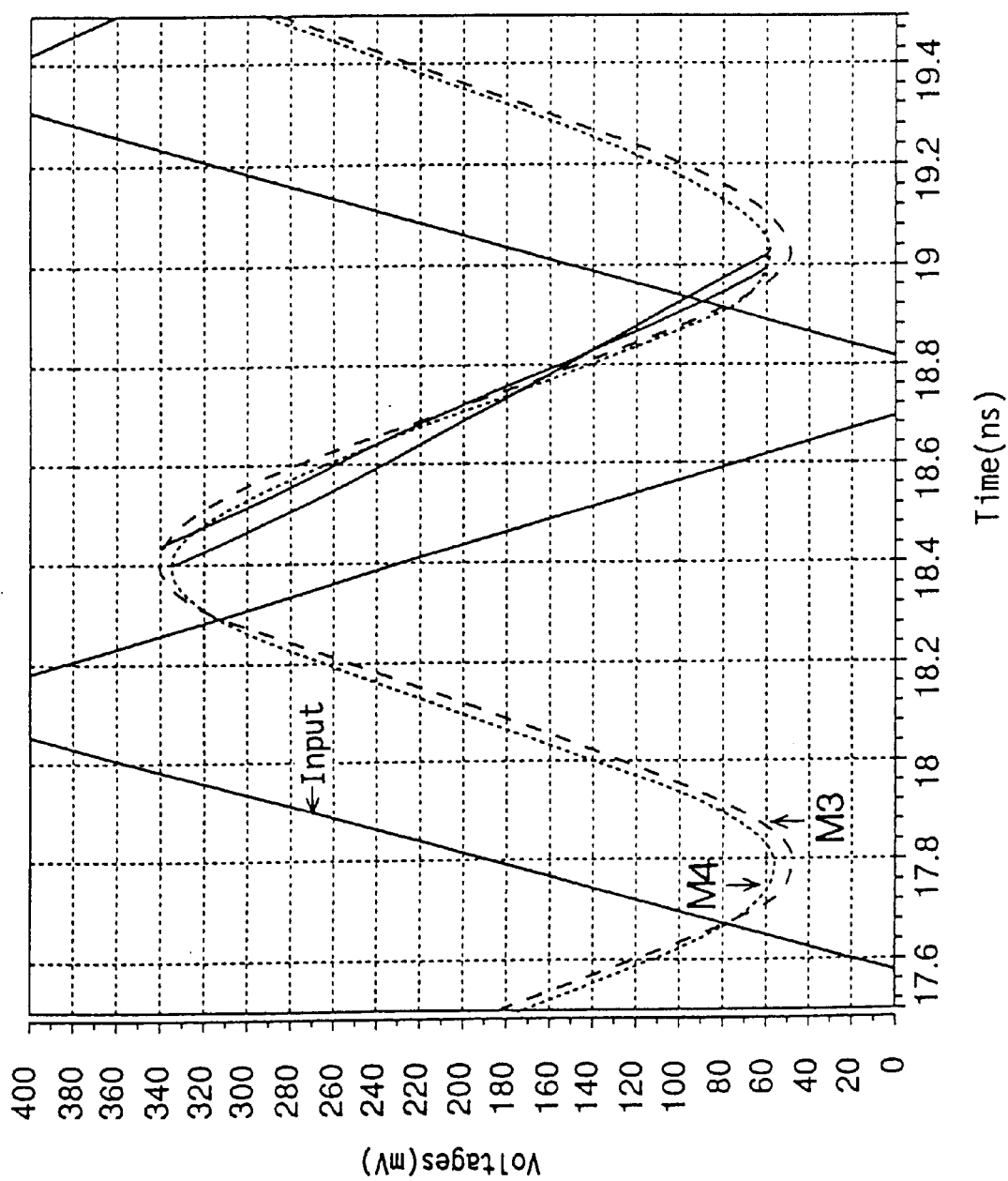
FIG. 16 is another graphical representation showing electrical characteristics of the lines according to the related art.

Lines M3 and M4 are used as models for the simulation of the two adjacent lines in the different layers. The line M4 has a line length of 17.944 mm, a wire length of 1.895 mm and a total wiring length of 19.839 mm. The difference between the total wiring lengths of the two lines M3 and M4 is 0.410 mm. FIG. 16 shows the result of this simulation. As shown in FIG. 16, the transmission difference between the two lines M3 and M4 is 14.30 ps.

As can be seen from the above-described simulations, when comparing the difference of the transmission time between the equal-length lines for the differential signals and the difference of the transmission time between the lines which are not equal-length lines, the difference in time is smaller between the equal-length lines for both the same layer and different layers. Therefore, it is shown that the time lag between the differential signals is reduced by using equal-length lines.

Further, the present invention is not limited to these embodiments, but variations and modifications may be made without departing from the scope of the present invention.

The present application is based on Japanese priority application No. 9-228548 filed on (Aug. 25, 1997) the entire contents of which are hereby incorporated by reference.

What is claimed is:

1. A chip package comprising:

an area for mounting thereon;

a plurality of lines for connecting said chip and external terminals; and a multilayer structure having layers provided with said plurality of lines thereon, wherein the plurality of lines include at least two lines that are adjacent each other and have an equal length to transmit different signals between the chip and the external terminals; and wherein said lines having equal lengths are provided on different ones of said layers.

2. The chip package as claimed in claim 1, wherein each of said at least two lines has bent portions.

3. The chip package as claimed in claim 1, further comprising a double-layer structure having an upper layer and a lower layer provided with said plurality of lines thereon, wherein said lines provided on said upper layer are offset by half a pitch from said lines provided on said lower layer, and wherein, when a pair of lines having equal lengths for transmitting differential signals are provided on either one of said upper layer and said lower layer, a line on the other one of said upper layer and said lower layer positioned between said pair of lines is at least one of a terminating resistance line and a power supply/ground line.

* * * * *